United States Patent
Lee et al.

(10) Patent No.: US 9,257,564 B2
(45) Date of Patent: Feb. 9, 2016

(54) THIN FILM TRANSISTOR AND METHOD OF FABRICATING SAME

(71) Applicant: Ye Xin Technology Consulting Co., Ltd., Hsinchu (TW)

(72) Inventors: Chih-Lung Lee, Hsinchu (TW); Po-Li Shih, Hsinchu (TW)

(73) Assignee: Ye Xin Technology Consulting Co., Ltd., Hsinchu (TW)

( * ) Notice: Subject to any disclaimer, the term of this patent is extended or adjusted under 35 U.S.C. 154(b) by 0 days.

(21) Appl. No.: 14/307,218

(22) Filed: Jun. 17, 2014

(65) Prior Publication Data

US 2014/0374746 A1    Dec. 25, 2014

(30) Foreign Application Priority Data

Jun. 21, 2013  (TW) .............................. 102122141 A

(51) Int. Cl.
*H01L 29/786* (2006.01)
*H01L 29/66* (2006.01)

(52) U.S. Cl.
CPC ...... *H01L 29/7869* (2013.01); *H01L 29/66969* (2013.01)

(58) Field of Classification Search
USPC ........................................................ 257/43
See application file for complete search history.

(56) References Cited

U.S. PATENT DOCUMENTS

| | | | | |
|---|---|---|---|---|
| 2010/0295042 A1* | 11/2010 | Yano et al. | ...................... | 257/43 |
| 2011/0240998 A1* | 10/2011 | Morosawa et al. | ............. | 257/57 |
| 2012/0313092 A1* | 12/2012 | Shieh et al. | ..................... | 257/43 |
| 2013/0032804 A1* | 2/2013 | Kim et al. | ........................ | 257/59 |
| 2013/0153891 A1* | 6/2013 | Zan et al. | ........................ | 257/43 |
| 2015/0028326 A1* | 1/2015 | Kenji | .............................. | 257/43 |
| 2015/0056761 A1* | 2/2015 | Wu et al. | ....................... | 438/158 |

FOREIGN PATENT DOCUMENTS

| | | |
|---|---|---|
| TW | 200926417 A | 6/2009 |
| TW | 200941729 A | 10/2009 |
| TW | 201133785 A | 10/2011 |

* cited by examiner

*Primary Examiner* — Thao P Le
(74) *Attorney, Agent, or Firm* — Novak Druce Connolly Bove + Quigg LLP

(57) ABSTRACT

A thin film transistor (TFT) includes a gate, a drain, a source, an insulating layer, a metal oxide layer, and an etch stopper layer. The metal oxide layer includes a source area, a drain area, and a channel area. The source is electrically coupled to the source area and the drain is electrically coupled to the drain area. Oxygen ions are implanted into the channel area via a surface treatment process to make an oxygen concentration of the channel area be greater than an oxygen concentration of each of the source area and the drain area.

5 Claims, 6 Drawing Sheets

THIN FILM TRANSISTOR AND METHOD OF FABRICATING SAME

CROSS-REFERENCE TO RELATED APPLICATIONS

This application claims priority to Taiwanese Patent Application No. 102122141 filed on Jun. 21, 2013 in the Taiwan Intellectual Property Office, the contents of which are incorporated by reference herein.

FIELD

Embodiments of the present disclosure generally relate to a fabricating method of thin film transistors, and more particularly, to a fabricating method of a thin film transistor having a metal oxide layer.

BACKGROUND

Metal oxide materials, such as indium zinc oxides (IZO) and indium gallium zinc oxides (IGZO) are widely used in thin film transistors (TFT). The TFT having the metal oxide layer, such as IGZO TFT can be used in the TFT backplane of flat-panel displays (FPDs) to improve the speed, resolution and size of the FPDs.

BRIEF DESCRIPTION OF THE DRAWINGS

Implementations of the present technology will now be described, by way of example only, with reference to the attached figures.

DETAILED DESCRIPTION

Figure 1:
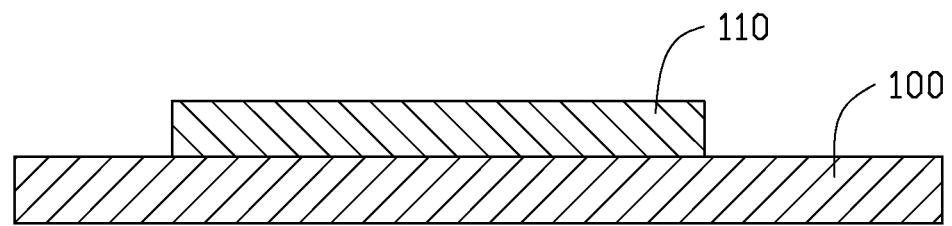
FIGS. 1-5 are cross-sectional views demonstrating how a thin film transistor (TFT) having a metal oxide layer can be fabricated.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The present disclosure is described in relation to a method for fabricating a thin film transistor (TFT).

FIG. 1 illustrates that a substrate 100 is provided to fabricate the TFT thereon. The substrate 100 can be made of transparent or translucent materials, such as glass, plastics, and resins. Then, a gate 110 of the TFT is formed on the substrate 100. In the embodiment, the gate 110 can be made of conductive materials, such as aluminum, copper, and molybdenum. The gate 110 is a multi-layer structure. For example, the gate 110 can include two aluminum layers and one molybdenum layer sandwiched therebetween.

Figure 2:
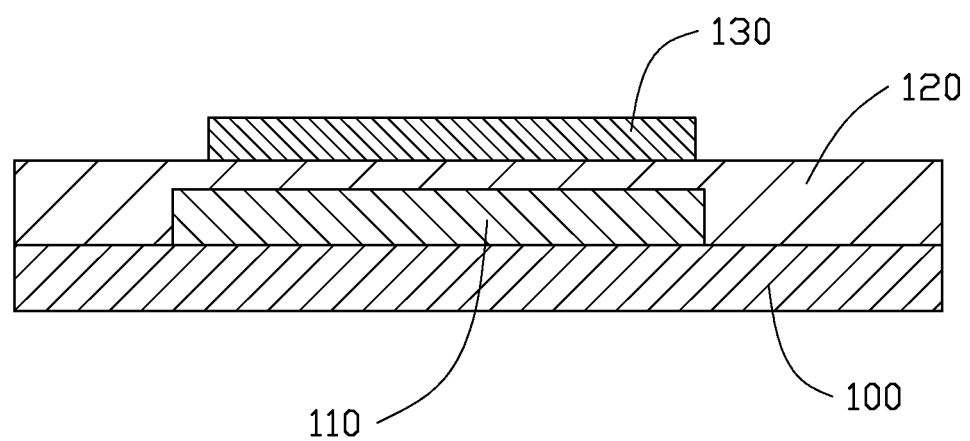

FIG. 2 illustrates that an insulating layer 120 is formed on the gate 110 to cover the gate 110 and the substrate 100. In addition, a patterned metal oxide layer 130 is formed above the insulating layer 120. The metal oxide layer 130 can be made of materials, such as indium gallium zinc oxide (IGZO), indium zinc oxide (IZO), gallium zinc oxide (GZO), zinc tin oxide (ZTO), or indium tin oxide (ITO). In this embodiment, the metal oxide layer 130 is an IGZO layer. In at least one embodiment, the insulating layer 120 can be formed by performing an atomic layer deposition process or a spin coating process onto the gate 110 and the substrate 100. The metal oxide layer 130 can be formed on the insulating layer 120 by performing a sputtering process according to a vacuum evaporation method.

Figure 3:
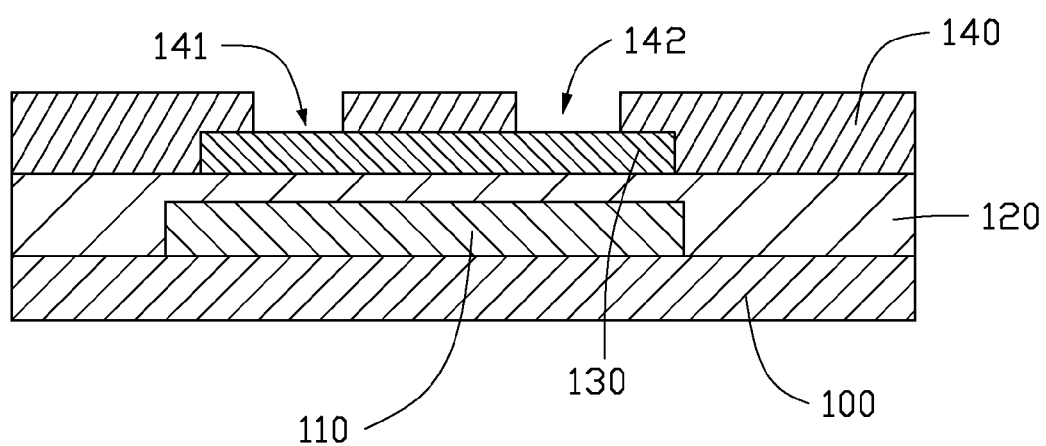

FIG. 3 illustrates that an etch stopper layer 140 is formed on the metal oxide layer 130 completely covering the metal oxide 130. Then, the etch stopper layer 140 is patterned to define a first contact hole 141 and a second contact hole 142 separated from each other. The metal oxide layer 130 is partially exposed from the first and second contact holes 141 and 142. In at least one embodiment, the etch stopper layer 140 can be made of dielectric materials such as silicon oxides.

Figure 4:
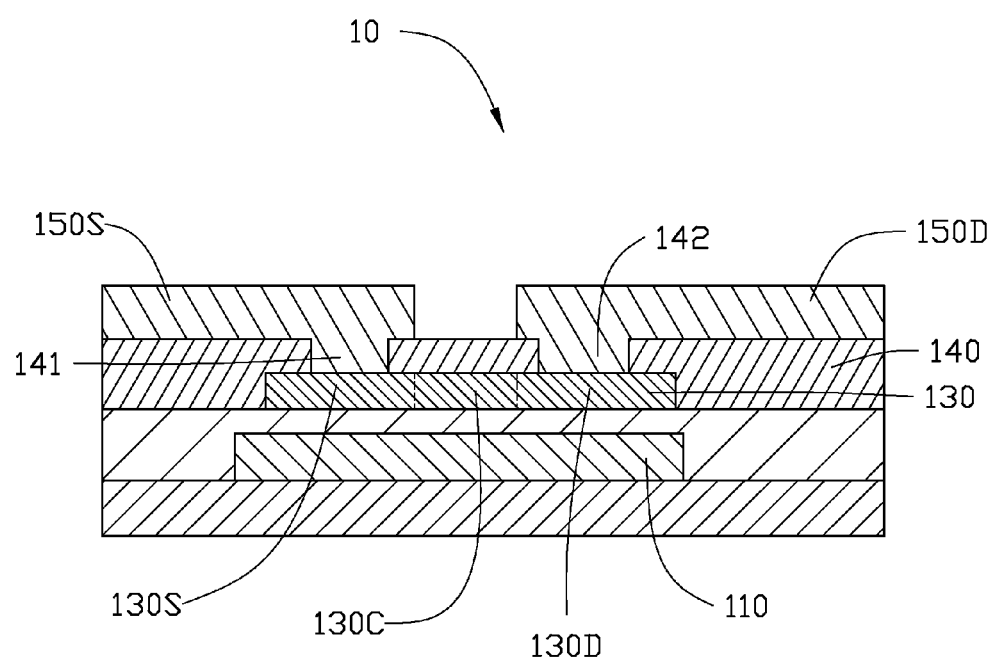

FIG. 4 illustrates that a source 150S and a drain 150D are formed on the etch stopper layer 140 and are located at two opposite sides of the etch stopper layer 140. The source 150S and the drain 150D are electrically coupled to the metal oxide layer 130 via the first and second contact holes 141 and 142. In at least one embodiment, both the source 150S and the drain 150D can have the same structure as the gate 110 and be made of the same conductive materials as the gate 110. Thus, as illustrated in FIG. 4, the metal oxide layer 130 includes a source area 130S under the source 150S, a drain area 130D under the drain 150D, and a channel area 130C between the source area 130S and the drain area 130D. The channel area 130C is covered by the etch stopper layer 140.

Figure 5:
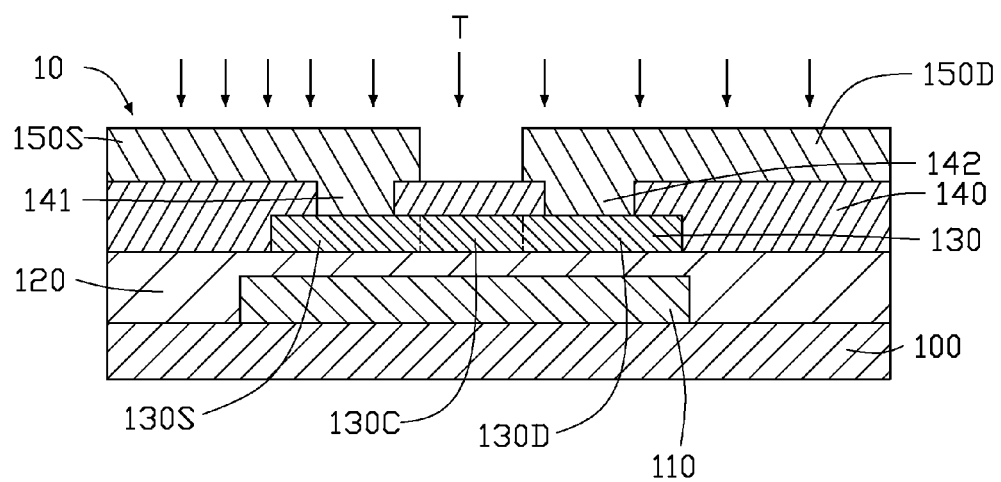

FIG. 5 illustrates that in order to improve the electrical stability of the TFT 10, a surface treatment process T is performed to the TFT 10. In at least one embodiment, the surface treatment process T employs an oxygen ion bombardment method to implant oxygen ions ($O^{2-}$) into the channel area 130C of the metal oxide layer 130. Thus, an oxygen concentration of the channel area 130C increases and an oxygen vacancy ratio of the channel area 130C consequentially decreases. Accordingly, the electrical stability of the TFT 10 is improved. Further, the etch stopper layer 140 can protect the channel area 130C from being damaged during the process of implanting oxygen ions into the channel area 130C. Since the source 150S and the drain 150D are made of metal materials, the source area 130S and the drain area 130D will not be influenced by the surface treatment process T. That is, the oxygen ions cannot be implanted into the drain area 130D and the source area 130S. Therefore, the oxygen concentration of the channel area 130C is greater than the oxygen concentration of each of the source area 130S and the drain area 130D, and the oxygen vacancy ratio of the channel area 130C is less than the oxygen vacancy ratio of each of the source area 130S and the drain area 130D.

In this embodiment, the fabricating process of the TFT 10 ends after the surface treatment process T. FIG. 5 illustrates that the TFT 10 includes the gate 110, the insulating layer 120, the metal oxide layer 130, the etch stopper layer 140, the source 150S, and the drain 150D. The gate 110 is located on the substrate 100, and the insulating layer 120 is coated on the substrate 100 and covers the gate 110. The TFT 10 can be used in a liquid crystal display (LCD) such as an in-plane switching (IPS) LCD.

Figure 6:
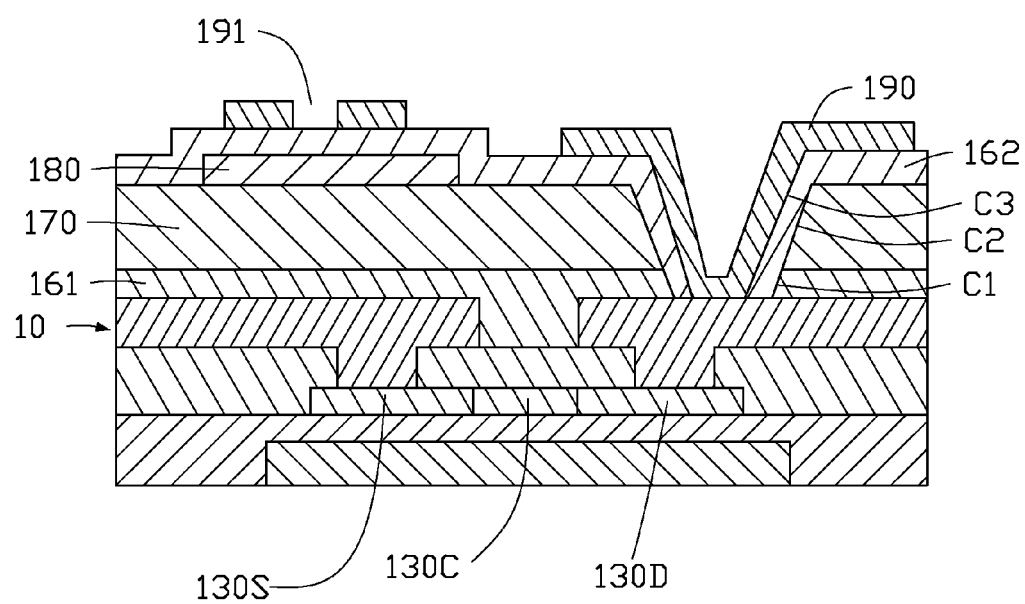
FIG. 6 is a schematic cross-sectional view of a flat-panel display having the TFT fabricated using the manner shown in FIGS. 1-5.

FIG. 6 illustrates a cross sectional view of an IPS LCD having the TFT 10. The IPS LCD further includes a first protection layer 161, an overcoating layer 170, a first electrode 180, a second protection layer 162, and a second electrode 190. The first protection layer 161 is located on the TFT 10. The overcoating layer 170 is located on the protection layer 160. The first electrode 180 is located on the overcoating layer 170. The second protection layer 162 covers both the first electrode 180 and the overcoating layer 170. The second electrode 190 is located on the second protection layer 162. The first protection layer 161 defines a first through hole C1, the overcoating layer 170 defines a second through hole C2 located within the first through hole C1, and the second protection layer 162 defines a third through hole C3 located within the second through hole C2. The second electrode 190 defines a plurality of slits 191 located above the first electrode 180. The second electrode 190 is electrically coupled to the drain 150D of the TFT 10 via the third through hole C3.

In at least one embodiment, the first protection layer 161 and the second protection layer 162 can be silicon oxides. The first electrode 180 and the second electrode 190 can be made of transparent materials, such as ITO and IZO.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A liquid crystal display (LCD) comprising:
a thin film transistor (TFT), a first protection layer formed on the TFT, an overcoating layer formed on the first protection layer, a first electrode formed on the overcoating layer, a second protection layer covering the first electrode and the overcoating layer, and a second electrode formed on the second protection layer, the TFT comprising:

a gate formed on a substrate;
an insulating layer formed on the substrate and covering the gate;
a metal oxide layer formed on the insulating layer;
an etch stopper layer coated on the metal oxide layer defining a first contact hole and a second contact hole;
a drain and a source respectively formed on two opposite sides of the metal oxide layer,
wherein the metal oxide layer comprises a source area, a drain area, and a channel area, each composed of at least one material having an oxygen concentration;
the source is electrically coupled to the source area via the first contact hole;
the drain is electrically coupled to the drain area via the second contact hole; and
the oxygen concentration of a material of which the channel area is composed is greater than an oxygen concentration of a material of which each of the source area and the drain area are composed.

2. The LCD according to claim 1, wherein an oxygen vacancy ratio of the channel area is less than an oxygen vacancy ratio of each of the source area and the drain area.

3. The LCD according to claim 1, wherein the source area is located under the source, the drain area is located under the drain, and the channel area is between the source area and the drain area.

4. The LCD according to claim 1, wherein the metal oxide layer is made of materials selected from indium gallium zinc oxide (IGZO), indium zinc oxide (IZO), gallium zinc oxide (GZO), zinc tin oxide (ZTO), and indium tin oxide (ITO).

5. The LCD according to claim 1, wherein the first protection layer defines a first through hole, the overcoating layer defines a second through hole located within the first through hole, and the second protection layer defines a third through hole located within the second through hole, and the second electrode is electrically coupled to the drain of the TFT via the third through hole.

* * * * *